United States Patent
Kosyachkov

(10) Patent No.: US 6,447,654 B1
(45) Date of Patent: Sep. 10, 2002

(54) SINGLE SOURCE SPUTTERING OF THIOALUMINATE PHOSPHOR FILMS

(75) Inventor: Alexander Kosyachkov, Mississuaga (CA)

(73) Assignee: iFire Technology Inc., Fort Saskatchewan (CA)

( * ) Notice: Subject to any disclaimer, the term of this patent is extended or adjusted under 35 U.S.C. 154(b) by 0 days.

(21) Appl. No.: 09/867,080

(22) Filed: May 29, 2001

(51) Int. Cl.[7] ............................................... C23C 14/34
(52) U.S. Cl. ................................................. 204/192.15
(58) Field of Search ....................... 204/192.12, 192.15, 204/192.26

(56) References Cited

U.S. PATENT DOCUMENTS

| | | | | |
|---|---|---|---|---|
| 4,389,295 A | * | 6/1983 | Davey et al. ............ | 204/192 P |
| 4,675,092 A | * | 6/1987 | Baird et al. ............ | 204/192.26 |
| 4,725,344 A | * | 2/1988 | Yocom et al. ......... | 204/192.15 |
| 5,432,015 A | | 7/1995 | Wu et al. .................. | 428/690 |

FOREIGN PATENT DOCUMENTS

WO   WO 00/70917   11/2000   ........... H05B/33/14

* cited by examiner

Primary Examiner—Steven H. Ver Steeg
(74) Attorney, Agent, or Firm—Fay, Sharpe, Fagan, Minnich & McKee, LLP

(57) ABSTRACT

A method of deposition of a phosphor in a single-source sputtering process, in which the phosphor is selected from the group consisting of ternary, quaternary or higher thioaluminate, thiogallate and thioindate phosphors, and composites thereof, synthesized with cations selected from Groups IIA and IIB of the Periodic Table of Elements. The phosphor is of a pre-determined composition of elements. The method comprising sputtering in a hydrogen sulphide atmosphere from a single source composition so as to deposit a composition on a substrate. The composition of the targets of the single source has a relative increase in concentration of elements of the phosphor that have a lower atomic weight compared to other elements in said phosphor. The relative increase is controlled such that deposition of the predetermined composition is effected on the substrate. Preferred phosphors are barium thioaluminate ($BaAl_2S_4$:Eu), and barium magnesium thioaluminates.

9 Claims, 1 Drawing Sheet

SINGLE SOURCE SPUTTERING OF THIOALUMINATE PHOSPHOR FILMS

FIELD OF THE INVENTION

The present invention relates to a single-source sputtering process for depositing controlled composition multi-element thin films for use as electroluminescent phosphors. The present invention also provides a phosphor of high luminosity and an emission color that can be tuned by adjusting the film composition. The process entails the use of a source material in the form of a single dense target that has a composition different from the desired film composition of the phosphor. The concentrations of light chemical elements relative to heavier chemical elements in the target composition of the process is higher than desired in the deposited films.

In embodiments, the present invention relates to improving the luminance and emission spectrum of phosphor materials used for full color ac electroluminescent displays employing this film dielectric layers with a high dielectric constant. Aspects of the invention also relate to reducing the cost of equipment used to deposit the phosphor materials onto the dielectric layers.

BACKGROUND OF THE INVENTION

A thick film dielectric structure provides for superior resistance to dielectric breakdown as well as a reduced operating voltage in comparison to thin film electroluminescent (TFEL) displays, as exemplified by U.S. Pat. No. 5,432,015. The thick film dielectric structure when it is deposited on a ceramic substrate tends to withstand higher processing temperatures than TFEL devices, which are typically fabricated on glass substrates. This increased high temperature tolerance facilitates annealing of phosphor films at higher temperatures to improve their luminosity. However, even with this enhancement, thick film electroluminescent displays have not achieved the phosphor luminance and color coordinates needed to be fully competitive with cathode ray tube (CRT) displays, particularly with recent trends in CRT specifications to higher luminance and higher color temperature. Some improvement may also be realized by increasing the operating voltage of the displays, but this increases the power consumption of the displays and decreases the reliability and increases the cost of driving electronics for the displays.

A high luminosity full color electroluminescent display requires that the thin film phosphor materials used for the red, green and blue sub-pixels be patterned so that the emission spectrum for each color of pixel is tailored to minimize the attenuation resulting from the use of optical filters that are needed to achieve the required color coordinates for each sub-pixel. For relatively low-resolution displays, the required patterning can be achieved by depositing the phosphor materials through a shadow mask. For high-resolution displays, however, the shadow mask technique does not provide adequate accuracy, and photolithographic methods must be employed. Photolithographic techniques, as exemplified in published PCT patent application WO 00/70917 to Wu et al., require the deposition of photoresist films and the etching or lift-off of portions of the phosphor film to provide the required pattern. Deposition and removal of photoresist films and etching and/or lift-off of phosphor films typically requires the use of solvent solutions that contain water or other protic solvents. These solutions may degrade the properties of phosphor materials, such as strontium sulphide that are subject to hydrolysis.

Traditionally, cerium-activated strontium sulphides for blue and manganese-activated zinc sulphides for red and green have been the phosphor materials of choice for full color electroluminescent displays. The optical emission from these phosphor materials must be passed through an appropriate chromatic filter to achieve the necessary color coordinates for red, green and blue sub-pixels, resulting in a loss of luminance and energy efficiency. The manganese-activated zinc sulphide phosphor has a relatively high electrical to optical energy conversion efficiency of up to about 10 lumens per watt of input power. The cerium-activated strontium sulphide phosphor has an energy conversion efficiency of 1 lumen per waft, relatively high for blue emission. However, the spectral emission for these phosphors is quite wide, with that for the zinc sulphide-based phosphor material spanning the color spectrum from green to red and that for the strontium sulphide based material spanning the range from blue to green. This necessitates the use of optical filters. The spectral emission of the cerium-activated strontium sulphide phosphor can be shifted to some degree towards the blue by controlling the deposition conditions and activator concentration, but not to the extent required to eliminate the need for an optical filter.

Alternate blue phosphor materials having narrower emission spectra tuned to provide the color coordinates required for blue sub-pixel have been evaluated. These include cerium-activated alkaline earth thiogallate compounds. Such blue phosphor materials tend to give good blue color coordinates, but have relatively poor luminosity and stability. Since the host materials are ternary compounds, it is relatively difficult to control the stoichiometry of the phosphor films.

Europium-activated barium thioaluminate provides excellent blue color coordinates and higher luminance, but it is also a ternary compound and stoichiometry is difficult to control. Vacuum deposition of phosphor films comprising this material from a single source target using sputtering or electron beam evaporation has not yielded films with high luminosity. Improved luminance of barium thioaluminate phosphors has been achieved by using a hopping electron beam deposition technique to deposit films from two source pellets. The stoichiometry of the deposited film is controlled using the relative dwell time of the electron beam impinging on each of the two source materials. However, this technique is not readily scalable to facilitate commercial production of large area displays and the process cannot be controlled to compensate for changes in the evaporation rates from the two sources as the deposition proceeds and the source pellets are depleted.

Another approach that has been adopted to improve the stoichiometry of the thioaluminate phosphors is to use more than one source for the deposition, but this approach requires added controls over the relative deposition rates for the different sources. The required relative evaporation rates must be calibrated for each specific piece of deposition equipment and the requirement for multiple sources constrains the design of the deposition equipment, generally adding to the cost of the equipment.

SUMMARY OF THE INVENTION

A single-source sputtering process for depositing controlled composition multi-element phosphors has now been found.

Accordingly, one aspect of the present invention provides a method of deposition of a phosphor in a single-source sputtering process, said phosphor being selected from the group consisting of ternary, quaternary or higher thioaluminate, thiogallate and thioindate phosphors, and composites thereof, synthesized with cations selected from Groups IIA and IIB of the Periodic Table of Elements, said phosphor having a pre-determined composition of elements and being activated with a rare earth element, said method comprising sputtering in a hydrogen sulphide atmosphere from a single source composition so as to deposit phosphor on a substrate, the composition of the single source having a relative increase in concentration of elements of said phosphor that have a lower atomic weight compared to other elements in said phosphor, said relative increase being controlled such that deposition of said pre-determined composition is effected on the substrate.

In a preferred embodiment of the method of the present invention, the phosphor is selected from the group consisting of activated barium thioaluminate ($BaAl_2S_4$:Eu) and barium magnesium thioaluminates ($Ba_aMg_{1-a}Al_2S_4$:Eu with 0<a<1).

In another embodiment, said cations include cations selected from the group consisting of barium, calcium, strontium, magnesium, zinc and cadmium.

In a further embodiment, the elements of lower atomic weight are at least one of magnesium and aluminum.

In a still further embodiment, the phosphor is activated with europium or cerium.

BRIEF DESCRIPTION OF THE DRAWINGS

The present invention is illustrated by the embodiments shown in the drawings, in which.

DETAILED DESCRIPTION OF THE INVENTION

Figure 1:
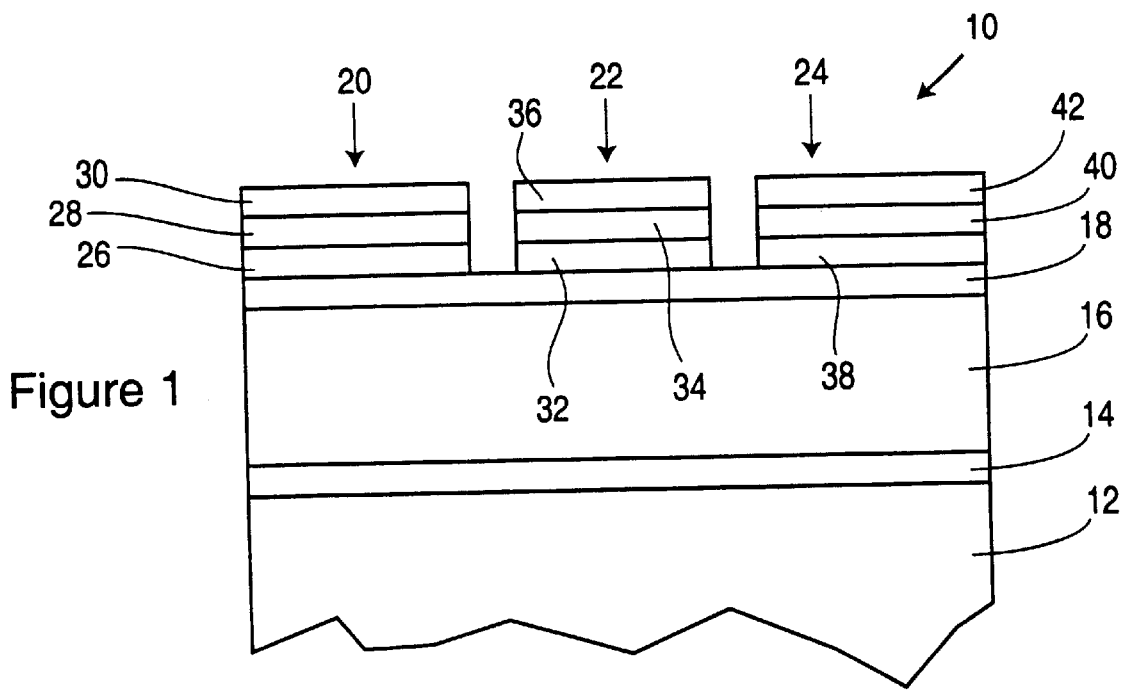
FIG. 1 shows a schematic representation of a cross-section of an electroluminescent element comprising a thick film dielectric layer and a phosphor composition typical of the present invention.

The present invention relates to a process for depositing multi-element thin films for electroluminescent phosphors with a high luminosity and emission color. The process also provides a sputtering means to deposit ternary and other chemically complex phosphor materials to achieve the desired stoichiometry, and to obtain high energy efficiency and high luminosity phosphor films.

Phosphor materials that have been successfully deposited to provide high electroluminescence are typically ternary or quaternary compounds, where the ratio of three or four constituent elements must be controlled to close tolerances. If stoichiometry of the compound is not adequately controlled, the phosphor material may show reduced performance and lifetime. In the present invention, stoichiometry control for the sputtering process is effected by adjusting the composition of the sputtering target material to compensate for aspects of the sputtering process that cause the elemental composition of the deposited film to be different from that of the target. Such aspects include differences in sticking coefficients of elements condensing onto the film as well as differential sputtering of elements from the surface of the target. These differences are a function of the specific target materials, the deposited film composition and the substrate material upon which the film is deposited.

It has been found that the target should be relatively rich in light elements, such as magnesium and aluminum, relative to the desired abundance of these elements in the deposited film. For example, to deposit an alkaline earth thioaluminate film with a nominal composition of $Mg_xBa_yAl_zS_w$:Eu, the target composition should have a concentration of magnesium and aluminum that is higher than that specified by the nominal composition.

As exemplified herein, phosphor materials comprising europium activated barium thioaluminate and europium-activated magnesium-barium thioaluminate have been deposited using the method described herein and have shown high luminance and energy efficiency.

The preferred substrate is a thick film ceramic material, which is known in the art. In embodiments, the substrate comprises a ceramic sheet, typically alumina, upon which an electrically conductive film, typically gold or a silver alloy, is deposited. A thick film layer consisting of a ferroelectric material and typically comprising one or more of lead magnesium niobate titanate, lead zirconate titanate or barium titanate is deposited on the electrically conductive film. The phosphor film is deposited on the thick film layer followed by an optically transparent but electrically conductive film to form the second electrode for the resultant sub-pixel.

Thin film dielectric layers may be deposited on the thick film layer to mediate undesirable chemical and physical interactions between the deposited phosphor film and the thick and other underlying layers. Thin film dielectric layers may also be deposited on top of the phosphor film prior to deposition of the optically transparent and electrically conductive film. Such further thin film dielectric layers may be comprised of alumina silicon oxynitride, yttria, hafnia zinc sulphide, barium tantalate, barium titanate, tantalum oxide, aluminum titanate, strontium titanate and the like.

Figure 2:
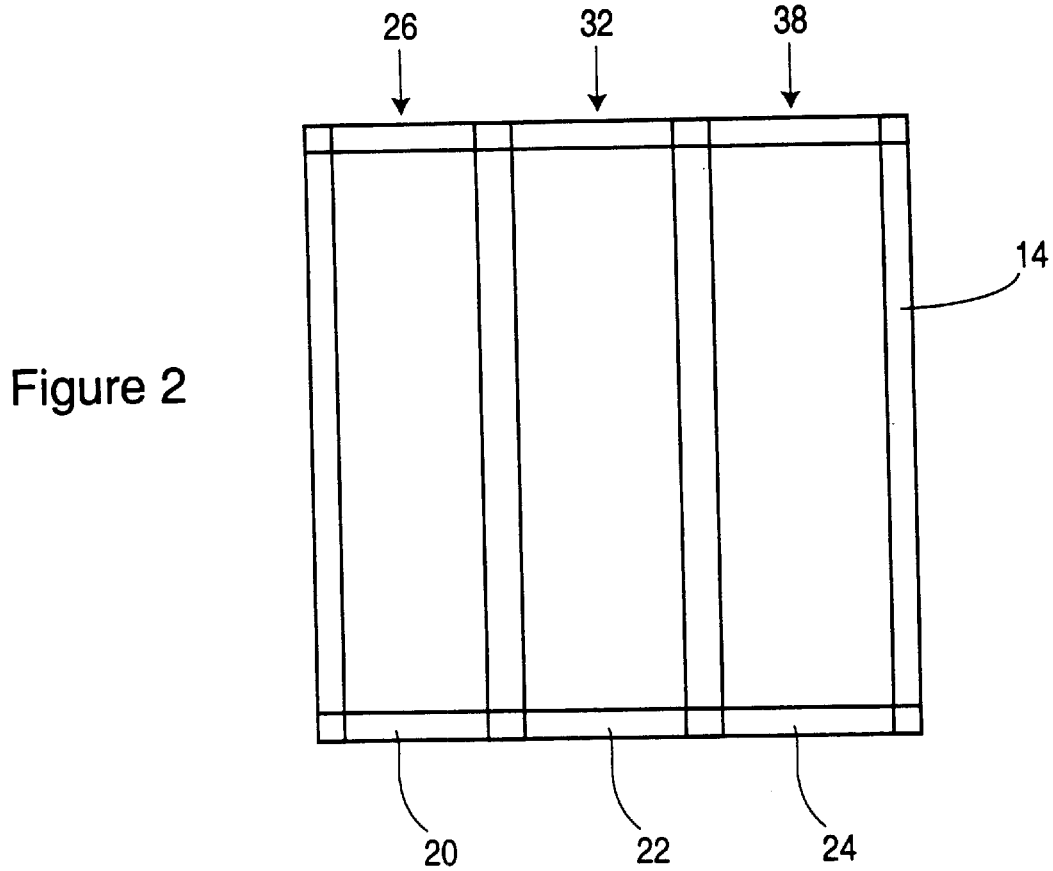
FIG. 2 shows a schematic representation of a plan view of a full color electroluminescent pixel and its constituent sub-pixels.

The present invention is further illustrated by the embodiment shown in FIGS. 1 and 2. FIG. 1 shows a cross-section of an electroluminescent device utilizing a phosphor of the present invention. FIG. 2 shows a plan view of the electroluminescent device. The electroluminescent device, generally indicated by 10, has a substrate 12 on which is located row electrode 14. Thick film dielectric 16 has thin film dielectric 18 thereon. Thin film dielectric 18 is shown with three pixel columns, referred to as 20, 22 and 24, located thereon. The pixel columns contain phosphors to provide the three basic colors viz. red, green and blue. Pixel column 20 has red phosphor 26 located in contact with thin film dielectric 18. Another thin film dielectric 28 is located on red phosphor 26, and column electrode 30 is located on thin film dielectric 28. Similarly, pixel column 22 has green phosphor 32 on thin film dielectric 18, with thin film dielectric 34 and column electrode 36 thereon. Pixel column 24 has blue phosphor 38 on thin film dielectric 18, with thin film dielectric 40 and column electrode 42 thereon.

The present invention relates to a method of deposition of ternary, quaternary and higher compounds, including other chemically complex compositions, especially phosphors, to achieve the desired stoichiometry, and high energy efficiency and high luminosity phosphor films. Phosphors in the form of ternary, quaternary or higher compounds may be deposited to provide high electroluminescence. However, the ratio of the three or four, or more, constituent elements must be controlled to close tolerances. Control of stoichiometry is important in achieving optimum performance of the phosphor. In the present invention, such control is facilitated by varying the composition of the source or target composition, the composition being varied by providing a controlled excess of elements that have a lower atomic weight.

Phosphor materials comprising europium-activated barium thioaluminate (BaAl$_2$S$_4$:Eu) and barium magnesium thioaluminates (Ba$_a$Mg$_{1-a}$Al$_2$S$_4$:Eu with 0<a<1) may be deposited using the method described herein and have shown high luminance and energy efficiency. It is believed that the method is also applicable to other ternary, quaternary or higher thioaluminate, thiogallate and thioindate phosphors and composites thereof synthesized with the cation or cations for these compounds selected from Groups IIA and IIB of the Periodic Table of Elements in which the target compositions contains mixtures of elements of different atomic weights. Examples of such cations include barium, calcium, strontium, magnesium, zinc and cadmium.

The phosphor compositions may be activated with a variety of dopants, especially europium and cerium.

The method of the invention is believed to be applicable to any ternary, quaternary or higher composition deposited on a substrate. It will be understood that the various source materials would be selected so that a vapour may be created for condensation on the substrate. The preferred substrate is a substrate that is opaque in the visible and infrared regions of the electromagnetic spectrum. In particular, the substrate is a thick film dielectric layer on a ceramic substrate. Examples of such substrates include alumina, and metal ceramic composites.

In preferred embodiments, the phosphors are europium-activated barium thioaluminates, optionally including magnesium as described above, which are believed to be less susceptible to hydrolysis than cerium-activated strontium sulphide, thus rendering them easier to pattern using photolithographic techniques.

The deposition of the composition may be carried out in an atmosphere of H$_2$S, sulphur or other volatile sulphur bearing compounds that will not contaminate the phosphor film as it is deposited if there is a tendency for the deposited compound to be deficient in sulphur. In particular, the deposition is done in a hydrogen sulphide atmosphere so that sputtered species in the film can react with sulphide derived from the hydrogen sulphide to adequately saturate the deposited film with sulphide and achieve the desired film composition. However, in some instances, it may be possible to operate the method without an atmosphere of H$_2$S.

The present invention provides a method for depositing controlled composition multi-element thin films for use as electroluminescent phosphors that can be tuned by adjusting the film composition. Phosphors with a high luminosity and emission color are obtained. The luminosity and emission spectra of electroluminescent phosphor films may be optimized by controlling and adjusting the elemental composition of the films.

Thus, the present invention provides a method of deposition of ternary, quaternary or higher phosphor compositions, especially onto an opaque substrate. The deposition can be done in any contemporary rf magnetron sputtering system, such as those marketed by Edwards, Ulvac and Leybold, that is fitted with a gas injection and exhaust system capable of handling hydrogen sulphide and has a deposition substrate heating means.

Table 1 shows a range for the target compositions and deposition conditions for typical phosphor films made according to the present invention.

TABLE 1

| | Phosphor |
|---|---|
| Target Composition (mole ratio relative to BaS) | |
| Al$_2$S$_3$ | 1.5–2.0 |
| BaS | 1.0 |
| MgS | 0–2.5 |
| EuS | 0.02–0.07 |
| Deposition rate (nm/min) | 20–70 |
| H$_2$S Partial Pressure (torr) | (1–6) × 10$^4$ |
| Ar to H$_2$S flow ratio | 1–5 |
| Substrate Temperature (° C.) | 150–350 |
| Phosphor Film Thickness (nm) | 350–650 |
| Phosphor Annealing Temperature (° C.) | 650–750 |

The performance of phosphors made using the range of parameters given in Table 1 is shown in Table 2.

TABLE 2

| Luminance at 60 V above threshold and 240 Hz (Cd/m$^2$) | >150 |
|---|---|
| CIE x coordinate | <0.14 |
| CIE y coordinate | <0.12 |
| Threshold Voltage (V) | <225 |

The present invention is illustrated by the following examples.

EXAMPLE I

A europium-doped magnesium barium thioaluminate phosphor film was formed on a thick film substrate and subsequently annealed at a temperature of about 750° C. for 10 minutes in nitrogen. The thick film substrate comprised a 5 cm by 5 cm by 0.1 cm thick alumina substrate upon which a gold electrode was deposited. A thick film high dielectric constant dielectric layer was then deposited in accordance with the methods exemplified by WO 00/70917. A thin film dielectric consisting of alumina with a thickness of 100–200 nm was deposited on top of the thick film dielectric and the phosphor was sputtered on top of the alumina layer using the sputtering process of this invention.

The nominal composition of the sputtering target was Mg$_{.0.67}$Ba$_{.0.33}$Al$_{1.3}$S$_3$:Eu where the atomic ratio of europium to barium was 0.03 The target, cylindrical in shape and with a diameter of 3 inches and a thickness of 4 mm, was fabricated using powders of magnesium sulphide, barium sulphide, aluminum sulphide and europium sulphide that had been passed through a 100 mesh screen and then mixed in the appropriate ratios. The mixed powder was placed in a die and pressed at 50,000 psi to compact the powder. The pressed compact was then sintered under nitrogen at a temperature of 900° C. for 10 minutes.

Deposition was done in an argon and hydrogen sulphide atmosphere with a hydrogen sulphide partial pressure of 5×10$^{-4}$ torr. The flow ratio of argon to hydrogen sulphide was 1.8. The deposition rate was 59 nanometers per minute onto a substrate at a temperature of 300° C. Following deposition, the phosphor-coated substrate was annealed under a nitrogen atmosphere at 700° C. for 10 minutes. Subsequently, a second alumina thin film and an indium tin oxide transparent conductor were deposited to provide a second electrode.

The device fabricated as described above was tested using alternating polarity 36 microsecond wide pulses with a peak voltage of 280 volts and a frequency of 240 Hz. The emission color was blue. The luminance measured at the voltage of 60 volts above the threshold voltage was 155 to 185 candelas per square meter, the CIE x coordinate was 0.14 and the CIE y coordinate was 0.122 to 0.126. The threshold voltage was 215 to 220 volts.

EXAMPLE II

An electroluminescent device was constructed with a design similar to that in Example I, except that the target had the nominal composition $Mg_{0.64}Ba_{0.36}Al_{1.9}S_{2.9}$:Eu, where the atomic ratio of europium to barium was 0.03. The processing conditions were also similar to those for Example I, except that the partial pressure of hydrogen sulphide during phosphor deposition was $3.3\times10^{-4}$ torr, the flow ratio of argon to hydrogen sulphide was 2.7, the phosphor deposition rate was 33 nanometers per minute, the substrate temperature during deposition was 280° C., the thickness of the deposited phosphor was 650 nanometers and the phosphor annealing temperature was 750° C.

This device was tested using the same pulsed driving waveform as for Example I. The emission color obtained was also blue. The luminance measured at the voltage of 60 volts above the threshold voltage was 160 candelas per square meter, the CIE x-coordinate was 0.14, the CIE y-coordinate was 0.10 and the threshold voltage was 220 volts.

EXAMPLE III

An electroluminescent device was constructed with a design similar to that in Example I, except that the nominal target composition had no magnesium, the partial pressure of hydrogen sulphide during phosphor deposition was $3.3\times10^{-4}$ torr, the phosphor deposition rate was 33 nanometers per minute, and the phosphor annealing temperature was 750° C.

This device was tested using the same pulsed driving waveform as for Example I. The emission color was also blue. The luminance measured at a voltage 60 volts above the threshold voltage was 177 candelas per square meter, the CIE x-coordinate was 0.136, the CIE y-coordinate was 0.102 and the threshold voltage was 224 volts.

What is claimed is:

1. A method of deposition of a phosphor in a single-source sputtering process, said phosphor being selected from the group consisting of ternary, quaternary or higher thioaluminate, thiogallate and thioindate phosphors, and composites thereof, synthesized with cations selected from Groups IIA and IIB of the Periodic Table of Elements, said phosphor having a pre-determined composition of elements, said method comprising sputtering in a hydrogen sulphide atmosphere from a single source composition so as to deposit the phosphor on a substrate, the single source composition having a relative increase in concentration of elements of said phosphor that are of greater volatility compared to other elements in said phosphor, said relative increase being controlled such that deposition of said pre-determined composition of elements is effected on the substrate.

2. The method of claim 1 in which the phosphor is selected from the group consisting of activated barium thioaluminate and activated barium magnesium thioaluminate.

3. The method of claim 2 in which the activated barium magnesium thioaluminate is of the formula $Ba_aMg_{1-a}Al_2S_4$:Eu with $0<a<1$.

4. The method of claim 2 in which the activated barium thioaluminate has the formula $BaAl_2S_4$:Eu.

5. The method claim 1 in which the elements of greater volatility are at least one of magnesium and aluminum.

6. The method of claim 1 in which the phosphor is activated with europium or cerium.

7. The method of claim 1 in which the single source composition has a mole ratio, relative to BaS, of $Al_2S_3$ in the range of 1.5–2.0, and of MgS in the range of 0–2.5.

8. The method of claim 7 in which the mole ratio of EuS, relative to BaS, is in the range of 0.02–0.07.

9. The method of claim 1 in which said cations are selected from the group consisting of barium, calcium, strontium, magnesium, zinc and cadmium.

* * * * *